US011605932B2

(12) United States Patent
Shin et al.

(10) Patent No.: US 11,605,932 B2
(45) Date of Patent: Mar. 14, 2023

(54) MONOLITHICALLY INTEGRATED MID-INFRARED TWO-DIMENSIONAL OPTICAL PHASED ARRAY

(71) Applicants: Jong-Dug Shin, Austin, TX (US); Ray T. Chen, Austin, TX (US); Jason Midkiff, Austin, TX (US)

(72) Inventors: Jong-Dug Shin, Austin, TX (US); Ray T. Chen, Austin, TX (US); Jason Midkiff, Austin, TX (US)

(73) Assignee: Omega Optics, Inc., Austin, TX (US)

( * ) Notice: Subject to any disclaimer, the term of this patent is extended or adjusted under 35 U.S.C. 154(b) by 199 days.

(21) Appl. No.: 17/093,612

(22) Filed: Nov. 9, 2020

(65) Prior Publication Data

US 2023/0036709 A1 Feb. 2, 2023

Related U.S. Application Data

(60) Provisional application No. 62/932,390, filed on Nov. 7, 2019.

(51) Int. Cl.
*H01S 5/10* (2021.01)
*H01S 5/026* (2006.01)
(Continued)

(52) U.S. Cl.
CPC ............ *H01S 5/1032* (2013.01); *H01S 5/026* (2013.01); *H01S 5/06246* (2013.01);
(Continued)

(58) Field of Classification Search
CPC .... H01S 5/1032; H01S 5/026; H01S 5/06246; H01S 5/18386; H01S 5/3402; H01S 5/3406; H01S 5/34313; H01S 5/50
See application file for complete search history.

(56) References Cited

U.S. PATENT DOCUMENTS

2020/0313397 A1* 10/2020 Jung .................... H01S 5/3406

OTHER PUBLICATIONS

Slivken, S., et al., Monolithic beam steering in a mid-infrared, surface-emitting, photonic integrated circuit. Sci Rep 7, 8472 (2017). (Year: 2017).*

(Continued)

*Primary Examiner* — Yuanda Zhang
(74) *Attorney, Agent, or Firm* — Taboada Law Firm, PLLC; John M. Taboada

(57) ABSTRACT

A novel, monolithically integrated mid-IR optical phased array (OPA) structure which eliminates the wafer bonding process to achieve highly efficient surface emitting optical beam steering in two dimensions is disclosed. Since solar energy is about 15-20 times smaller than that at 1.55 µm, mid-IR is more favorable for the atmospheric transmission due to lower solar radiance backgrounds. For the beam steering, thermo-optic phase shifting is used for azimuthal plane beam steering and laser wavelength tuning is used for elevation plane beam steering. The OPA structure disclosed comprises a wavelength-tunable a QCL, a 1×32 splitter, thermo-optic phase-shifters, and sub-wavelength grating emitters. The disclosed OPA provides a low-cost, low-loss, low-power consumption, robust, small footprint, apparatus that may be used with expendable UAV swarms. A LiDAR may be created by monolithically integrating a QCD with the apparatus. Other embodiments are described and claimed.

11 Claims, 8 Drawing Sheets

(51) Int. Cl.
*H01S 5/34* (2006.01)
*H01S 5/50* (2006.01)
*H01S 5/062* (2006.01)
*H01S 5/183* (2006.01)
*H01S 5/343* (2006.01)

(52) U.S. Cl.
CPC ........ *H01S 5/18386* (2013.01); *H01S 5/3402* (2013.01); *H01S 5/3406* (2013.01); *H01S 5/34313* (2013.01); *H01S 5/50* (2013.01)

(56) References Cited

OTHER PUBLICATIONS

Slivken, S., et al., Monolithic beam steering in a mid-infrared, surface-emitting, photonic integrated circuit. Sci Rep 7, 8472 (2017). (https://doi.org/10.1038/s41598-017-08916-9).

* cited by examiner

MONOLITHICALLY INTEGRATED MID-INFRARED TWO-DIMENSIONAL OPTICAL PHASED ARRAY

II. CROSS REFERENCE TO RELATED APPLICATIONS

This application claims the benefit of the filing date of U.S. Provisional Patent Application Ser. No. 62/932,390, filed on Nov. 7, 2019, entitled "A Monolithically Integrated Mid-Infrared Two-Dimensional Optical Phased Array," the entire disclosure of which is hereby incorporated by reference into the present disclosure.

I. STATEMENT REGARDING FEDERALLY SPONSORED RESEARCH

The U.S. Government has a paid-up license in this invention and the right in limited circumstances to require the patent owner to license others on reasonable terms as provided for by the terms of the contract FA8814-19-P-005 awarded by the Air Force Research Laboratory.

III. BACKGROUND

Field of the Invention

The present disclosure relates generally to the field of optical phased arrays, and more specifically to an apparatus and method for beam steering comprising a monolithically integrated mid-infrared (mid-IR) two-dimensional optical phased array for aerial-based applications such as long-range LiDAR and countermeasure. Thermo-optic tuning of the signal phase is used for the lateral, azimuthal steering and wavelength tuning is used for the elevation, longitudinal steering.

IV. SUMMARY

In one respect, disclosed is a mid-IR two-dimensional optical phased array comprising: an epitaxial wafer having a substrate; a bottom cladding disposed on the substrate; and an un-doped waveguide layer disposed on the bottom cladding, the epitaxial wafer comprising a lasing region, a passive waveguiding region adjacent to the lasing region, and a taper region between the lasing region and the passive waveguiding region; the lasing region comprising: a tunable quantum cascade laser disposed on a portion of the un-doped waveguide layer, the tunable quantum cascade laser having an active region sandwiched between an upper cladding and a lower cladding; an upper metal contact disposed above the upper cladding; and a lower metal contact positioned below the lower cladding, the tunable quantum cascade laser configured to generate mid-IR electromagnetic radiation light from the active region; the taper region configured to adiabatically couple the mid-IR electromagnetic radiation light from the active region into the un-doped waveguide layer; and the passive waveguiding region comprising: a splitter region adjacent to the taper region; the splitter region having a ridge waveguide configured to receive the mid-IR electromagnetic radiation light from the active region and split the mid-IR electromagnetic radiation light into two or more channels with one or more Y-junctions, the ridge waveguide formed into the un-doped waveguide layer and the bottom cladding and having a ridge waveguide cladding disposed over the ridge waveguide; a phase shifting region adjacent to the splitter region; the phase shifting region comprising individually controllable heaters disposed over the ridge waveguides of the two or more channels, the individually controllable heaters configured to modify phase of the mid-IR electromagnetic radiation light within each of the ridge waveguides of the two or more channels; and an emission grating region adjacent to the phase shifting region; wherein the ridge waveguides of the two or more channels within the emission grating region comprise exposed emitter gratings etched into the un-doped waveguide layer, the emitter gratings configured to emit the mid-IR electromagnetic radiation light from the ridge waveguides of the two or more channels within the emission grating region; wherein the emitted mid-IR electromagnetic radiation light is steerable in elevation by wavelength tuning of the tunable quantum cascade laser, and wherein the emitted mid-IR electromagnetic radiation light is steerable in azimuth by controlling of the heaters to modify the phase of the mid-IR electromagnetic radiation light within each of the two or more channels.

Numerous additional embodiments are also possible.

BRIEF DESCRIPTION OF THE DRAWINGS

Other objects and advantages of the invention may become apparent upon reading the detailed description and upon reference to the accompanying drawings.

Figure 1:
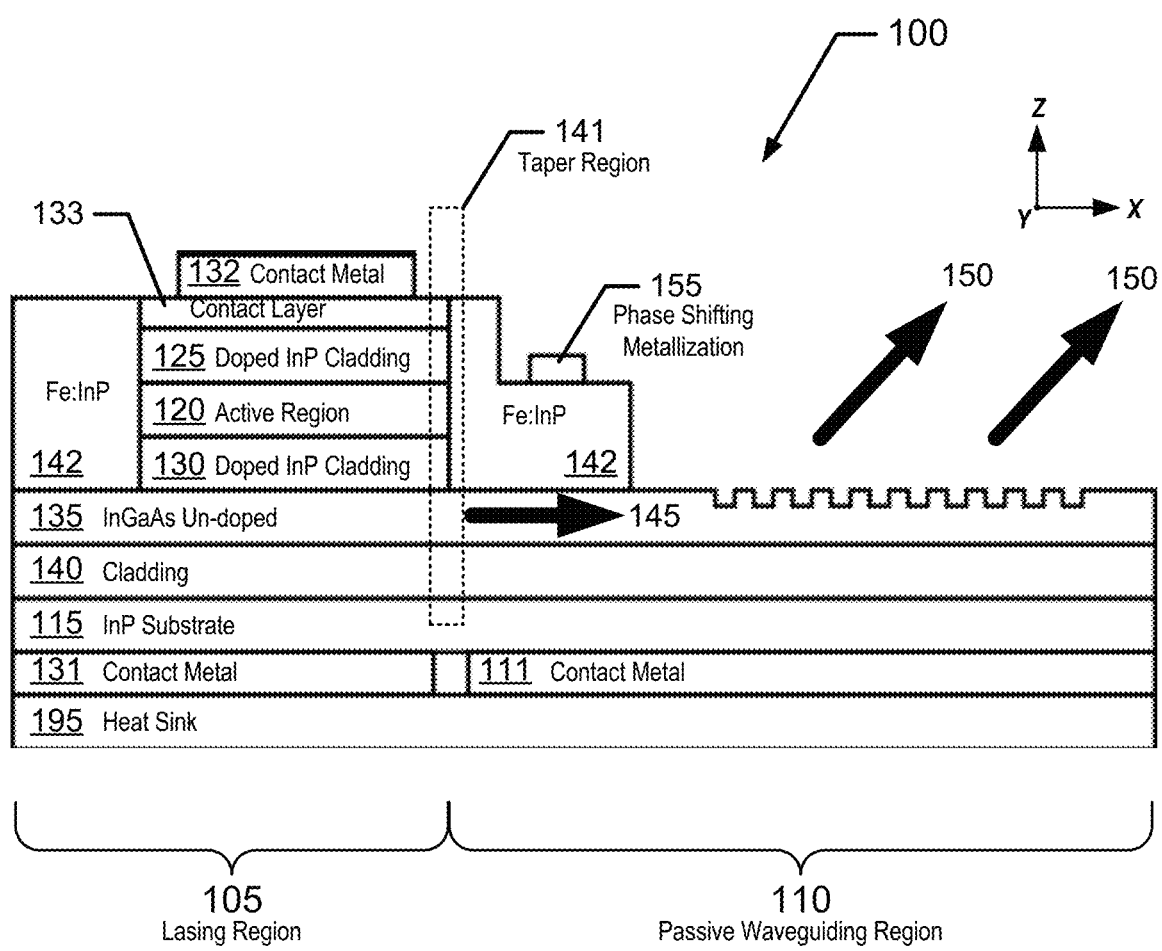
FIG. 1 is a schematic cross sectional diagram of a monolithically integrated mid-IR two-dimensional optical phased array, in accordance with some embodiments.

While the invention is subject to various modifications and alternative forms, specific embodiments thereof are shown by way of example in the drawings and the accompanying detailed description. It should be understood, however, that the drawings and detailed description are not intended to limit the invention to the particular embodiments. This disclosure is instead intended to cover all modifications, equivalents, and alternatives falling within the scope of the present invention as defined by the appended claims.

VI. DETAILED DESCRIPTION

One or more embodiments of the invention are described below. It should be noted that these and any other embodiments are exemplary and are intended to be illustrative of the invention rather than limiting. While the invention is widely applicable to different types of systems, it is impossible to include all of the possible embodiments and contexts of the invention in this disclosure. Upon reading this disclosure, many alternative embodiments of the present invention will be apparent to persons of ordinary skill in the art.

The advantages of optics over long wavelength microwave radar have already been proven in LiDAR and free-space optical communication links via demonstration of higher resolution imaging and inter-satellite communications. Non-mechanical beam control has been extensively studied. Various methods have been implemented such as planar electro-optic prisms in KTP, Lithium Niobate (LiNbO3), ferroelectric domain LiTaO3 and electro-optic (EO) polymers, thermo-optic planar prisms, diffractive liquid crystal (LC) phased arrays and diffractive acousto-optic (AO) techniques with respective advantages and disadvantages. EO crystals are very fast but have extremely small EO coefficients, resulting in very small steering angles and kilovolts of operating voltage. Additionally, EO crystals are quite expensive. LC optical phased array beam steerers tend to be slow, provide non-continuous diffractive steering, and have a very limited steering range because thick LC layers are problematic. AO beam steerers have a larger steering range, but are diffractive, and require very large power and expensive crystals.

Thus, a need exists for a non-mechanical, monolithically integrated, compact, lightweight, high-power, on-chip beam-steering device, operable in the mid-IR atmospheric window ($\lambda=3-5$ µm). The embodiment or embodiments described herein solve these problems and others by proposing a monolithically integrated, mid-IR two-dimensional beam steerable, Indium Phosphide based (InP) optical phased array.

FIG. 1 is a schematic cross sectional diagram of a monolithically integrated mid-IR two-dimensional optical phased array, in accordance with some embodiments.

Figure 2:
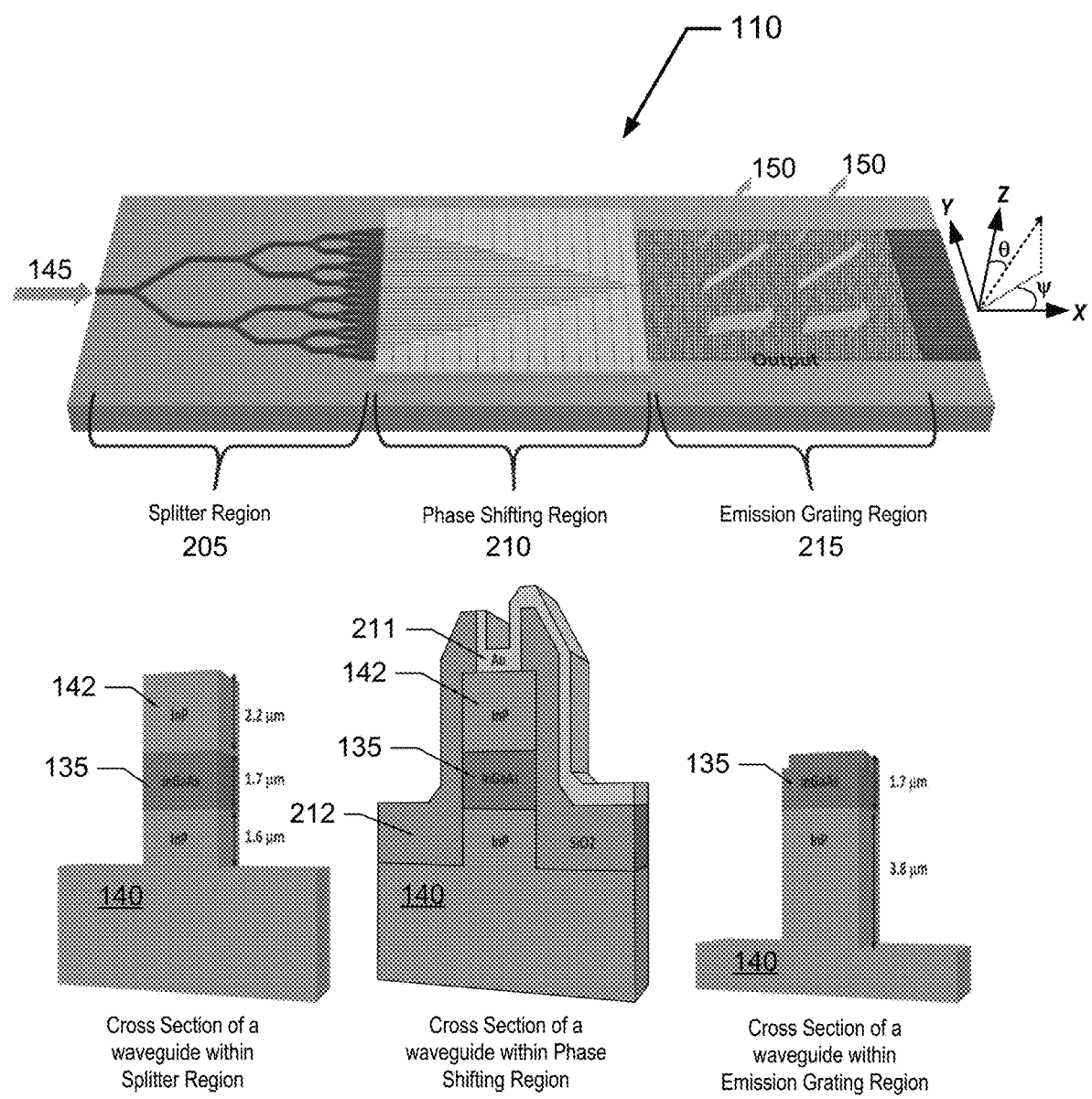
FIG. 2 is a schematic top view diagram of the passive waveguiding section along with cross section diagrams of a waveguide within the different regions of the passive waveguiding section of the OPA of FIG. 1, in accordance with some embodiments.

FIG. 2 is a schematic top view diagram of the passive waveguiding section along with cross section diagrams of a waveguide within the different regions of the passive waveguiding section of the OPA of FIG. 1, in accordance with some embodiments.

In some embodiments, the monolithically integrated mid-IR two-dimensional optical phased array 100 comprises a lasing region 105 and a passive waveguiding region 110. Both the lasing region and the passive waveguiding regions are monolithically integrated onto an InP substrate 115 and have their own lower contact metal layers, 131, 111. The lasing region 105 comprises a tunable In—P based quantum cascade laser (QCL) having an InGaAs active region 120 sandwiched between a doped InP upper cladding 125 and a doped InP lower cladding 130 and controlled via the lower metal contact 131 and an upper metal contact 132. A contact layer 133 separates the doped InP upper cladding and the upper metal contact. The lasing region is configured to generate electromagnetic radiation light around $\lambda=4.6$ µm. The light from the QCL is coupled into a passive underlying InGaAs un-doped waveguide 135. The coupling occurs within a taper region 141 at the interface between the lasing region and passive waveguiding region. An Fe:InP cladding 142 is used above the InGaAs un-doped waveguide in some portions within both the lasing region and the passive waveguiding regions. A lower InP cladding layer 140 separates the passive underlying InGaAs un-doped waveguide from the InP substrate. Once the light 145 is coupled to the InGaAs un-doped waveguide 135 within the passive waveguiding region 110, the light is split into two or more channels within a splitter region 205. In one embodiment, the splitter region comprises a 1×32 tree-array of Y-junctions having 500 µm radius s-bends with a total length of about 1.5 mm. After the light has been split into separate waveguides, a thermo-optic phase shifting region 210 is utilized to control the OPA beam steering in the azimuthal plane by controlling the phase of the guided light. In some embodiments, the electrodes 211 for the phase shifting metallization 155 are formed by deposition and lift-off of Cr/Au (5 nm/70 nm). The electrodes are insulated from the waveguides by a passivation layer 212 such as $SiO_2$. Contact openings through the passivation layer connect the electrodes of the phase shifters via an overlay metallization to probe pads at the perimeter of the waveguides. In some embodiments, the longitudinal length of the phase shifting region is about 2.35 mm. Lastly, the phase shifted lighted enters an emission grating region 215 comprising sub-wavelength grating emitters etched into the InGaAs un-doped waveguide 155. In some embodiments, the gratings are 600 nm deep with a pitch of 1.5 µm and a 1:1 duty cycle; the waveguide-to-waveguide pitch is 11.5 (2.5$\lambda$), and the longitudinal length of the emission grating region is about 3 mm. The emission grating region couples out the light from the monolithically integrated mid-IR two-dimensional optical phased array. The output light 150 is controllable in two-dimensions, by thermo-optic phase shifting for the azimuthal plane, $\Psi$, and wavelength tuning of the QCL for the elevation plane, $\theta$. The percent transmission to the air from the grating emitters becomes greater as the InGaAs un-doped waveguide layer gets thicker. In some embodiments, an air-gap may be created under the InGaAs un-doped waveguide layer within the emission grating region to obtain greater transmission. For the case of uniform waveguide spacing, the coupling becomes stronger to interference between adjacent emitters as the waveguide spacing gets narrower due to the nature of dielectric waveguides. In some embodiments, the lasing region and the passive waveguiding regions are in contact with a heat sink 195 to provide thermal stabilization.

In some embodiments, the monolithically integrated mid-IR two-dimensional optical phased array comprises the InP substrate 115 with a 3 µm lower InP cladding 140, a 2 µm passive underlying InGaAs un-doped waveguide 135, a 1 µm doped InP lower cladding 130, a 1.8 µm InGaAs active region 120, and a 3 µm doped InP upper cladding 125.

An OPA comprises several coherent emitters, whose constructive interference at certain angles in the far field produces a main lobe—or the "beam" of interest—and other secondary lobes (namely grating lobes with powers mimicking that of the main lobe and lower power sidelobes). Control of the emitters' phases can adjust the angles of constructive interference, effectively steering the beam. For multiple in-phase emitters, the constructive interference in the far-field is given by Equation 1, $$\sin\Psi = \frac{m\lambda_o}{d}, \qquad \text{(Equation 1)}$$

where m is the diffraction order (0, ±1, ±2, ... ), $\lambda_0$ is the free-space wavelength of the laser and d is the spacing between emitter gratings. By adjusting the emitter-to-emitter phase relation, the main radiation beam may be "steered" in the far field. Of interest is the steering of the single central peak within a field of view uninhabited by other radiation peaks. Letting φ be the incremental phase shift from emitter-to-emitter, a swing of φ from 0 to 2π shifts each peak to the location of the next order. Thus for the central peak of interest to move within a field-of-view, without such a field-of-view being invaded by another incoming order, the phase shift should be one half the cycle, i.e. φ from 0 to π. Replacing m with φ/2π in Equation 1 gives the relation for the azimuthal steering angle Ψ shown in Equation 2, $$\sin\Psi = \frac{\Psi}{2\pi}\frac{\lambda}{d}, \qquad \text{(Equation 2)}$$

where Ψ is the channel-to-channel phase increment, λ is the free-space wavelength, and d is the emitter-to-emitter spacing. The steering relation goes inversely with d in Equation 2, which means that smaller emitter-to-emitter spacing gives larger field-of-view. A theoretical maximum steering field of Ψ=±90° with φ=π would require d=$\lambda_0$/2, which is a half wavelength. In addition, the beam envelope is inversely proportional to a single emitter width, so that both emitter spacing and individual size are reduced to increase the breadth of steering. Since the reduction of these dimensions increases waveguide crosstalk, there is an inherent tradeoff between field-of-view and crosstalk. From Equation 1, spacing of d=2.5$\lambda_0$ and 3.0$\lambda_0$ gives peak separations of 23.5° and 19.5°, respectively. In one embodiment, a modest emitter-to-emitter spacing of 2.5λ is used to avoid cross-talk issues. Regarding beam width, the larger the number of emitter elements, the smaller the beam width, but more emitter elements lead to more complexity for biasing. In one embodiment, a modest value of 32 channels are used for reasonable beam size with manageable biasing circuitry.

Channel phase shifting is accomplished by index tuning through the thermo-optic effect. Current is injected directly through the undoped (n≈1×10$^{15}$ cm$^{-3}$) waveguides, thereby effecting ohmic heating of the waveguide. For a waveguide of length L, the accumulated phase for a temperature change ΔT with respect to another reference waveguide is given by Equation 3, $$\Delta\varphi = 2\pi\frac{L}{\lambda}\frac{dn}{dT}\Delta T, \qquad \text{(Equation 3)}$$

where dn/dT is the material's thermo-optic coefficient. In the InGaAs/InP platform, both materials possess dn/dT~2×10$^{-4}$ K$^{-1}$, so that with L=2350 μm, a phase shift Δφ=π requires ΔT~5 K.

For a planar OPA, the elevational steering angle θ by diffraction from a subwavelength grating as a function of wavelength is given by Equation 4, $$\theta = \sin^{-1}\{n_{eff}(\lambda) - \lambda/\Lambda\}, \qquad \text{(Equation 4)}$$

where $n_{eff}(\lambda)$ is the effective index of the waveguide, λ is the free-space wavelength, and Λ is the grating pitch. Thus, for a tunable QCL laser source, elevation beam steering is possible over an angle of 55° for wavelength tuning on the order of ~1 μm.

In some embodiments, the passive waveguiding region 110 comprises low-index contrast lattice-matched In$_{0.53}$Ga$_{0.47}$As/InP with indices of refraction 3.339/3.095, respectively, at λ=4.6 μm. Four-micrometer-wide ridge waveguides are formed within the InGaAs undoped waveguide 135 and InP cladding 142, 140. A schematic illustration of the passive waveguiding region layout along with cross section diagrams of a waveguide within the different regions of the passive waveguiding section of the OPA is illustrated in FIG. 2.

Figure 3:
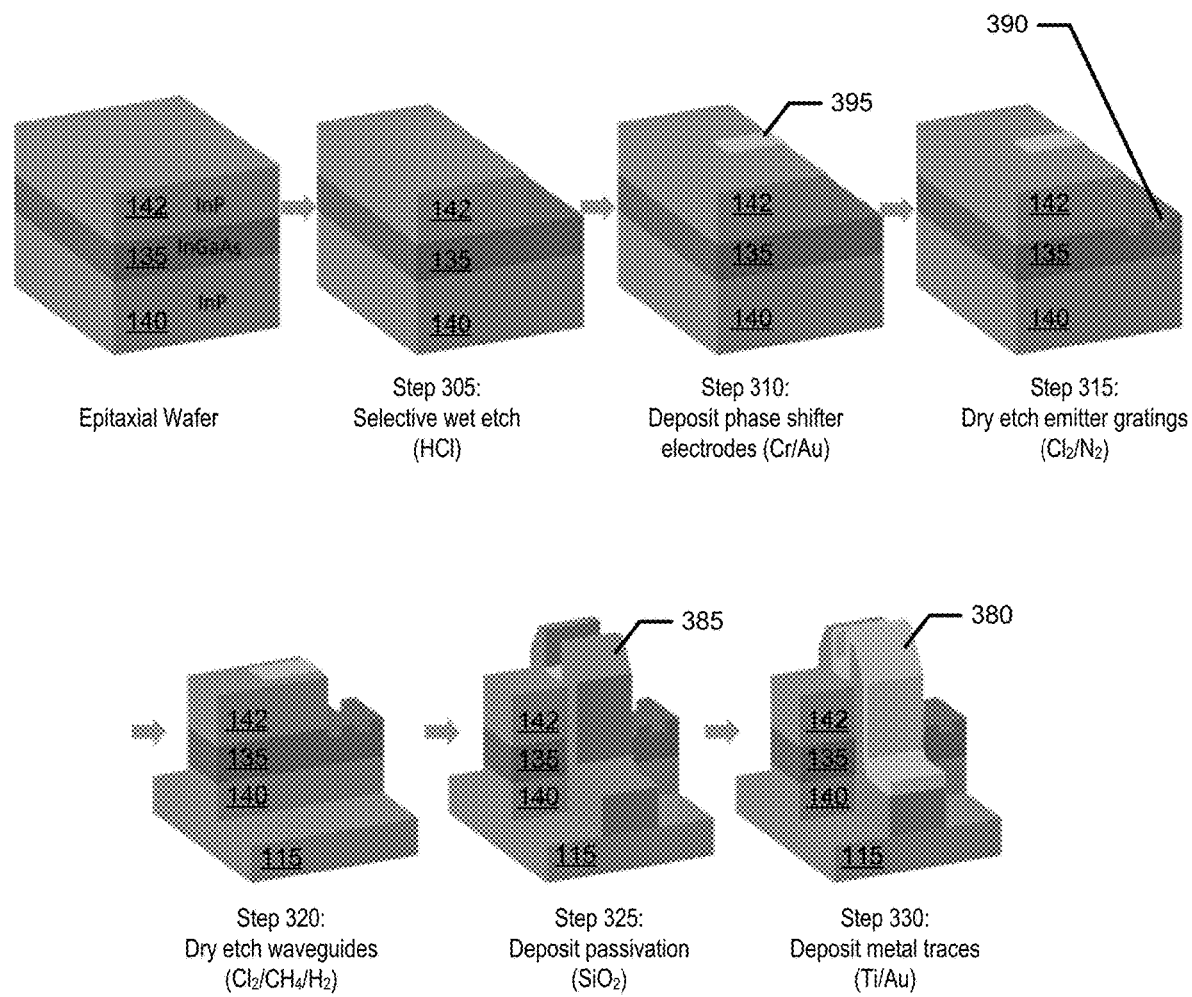
FIG. 3 is a schematic illustration of the fabrication steps of the azimuthal beam steering circuit of the OPA of FIG. 1, in accordance with some embodiments.

FIG. 3 is a schematic illustration of the fabrication steps of the azimuthal beam steering circuit of the OPA of FIG. 1, in accordance with some embodiments.

Figure 4:
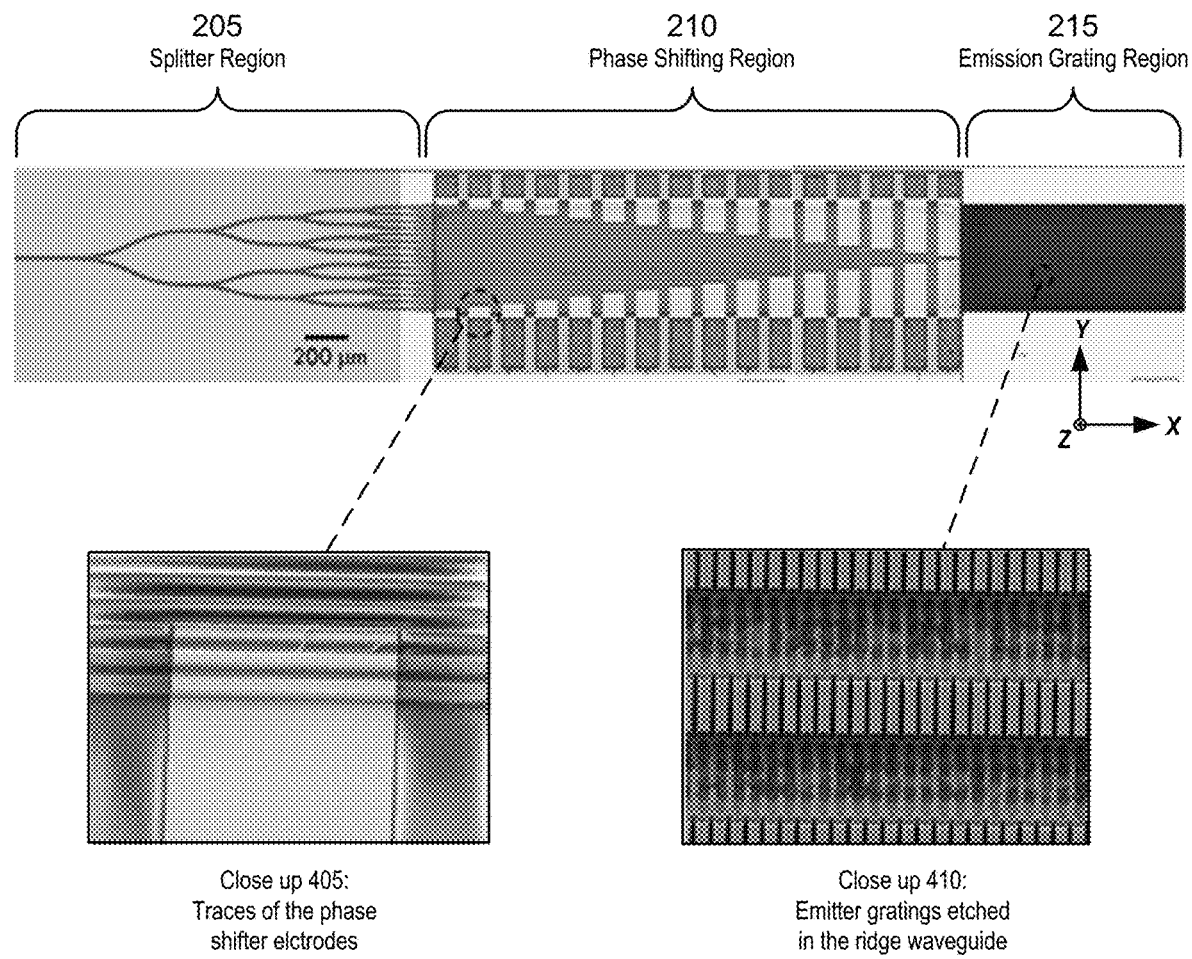
FIG. 4 is an SEM photo of the passive waveguiding section of the OPA of FIG. 1, in accordance with some embodiments.

FIG. 4 is an SEM photo of the passive waveguiding section of the OPA of FIG. 1, in accordance with some embodiments.

The fabrication process on the epitaxial wafer of the azimuthal beam steering circuit is shown schematically in FIG. 3 and begins with at step 305 a selective wet etch (HCl-based) of InP cladding layer 142 in the emitter region, leaving the InGaAs un-doped waveguide layer 135 exposed. Then, at step 310, the phase shifter electrodes 395 are formed by deposition and lift-off of Cr/Au (5 nm/70 nm) over the InP cladding layer 142 within the phase shifting region 210. Subsequently, at step 315, the emission gratings 390 are patterned by e-beam lithography and dry etched 500 nm into the InGaAs layer 135 by Cl$_2$/N$_2$ inductively coupled plasma. Next at step 320, the ridge waveguides within the passive waveguiding region 110 are etched by Cl$_2$/CH$_4$/H$_2$ inductively coupled plasma, etching through the InP layer 142, the InGaAs layer 135, the lower cladding 140, and into the InP substrate 115 to a total depth of 5.5 μm. At step 325, the waveguides are then passivated in the phase-shifter region with 2 μm SiO$_2$ 385 (for 1 μm sidewall coverage), and contact openings to the electrodes are opened by CHF$_3$/Ar reactive ion etching. Next at step 330, a sequence of Ti/Au (10 nm/200 nm) depositions, normal and angled for sidewall coverage, is carried out for creating the traces 380 from contacts 395 to pads; and the pads are thickened with a stack of Ti/Al/Ti/Au (50 nm/800 nm/50 nm/200 nm). FIG. 4 shows an SEM photo of one such fabricated passive waveguiding section having a 1×32 of Y-junctions having 500 μm radius s-bends with a total length of about 1.5 mm. Close up photo 405 shows the traces of the phase shifter electrodes of the ridge waveguide within the phase shifting region. Close up photo 410 shows the emitter gratings etched into the ridge waveguide within the emission grating region.

Figure 5:
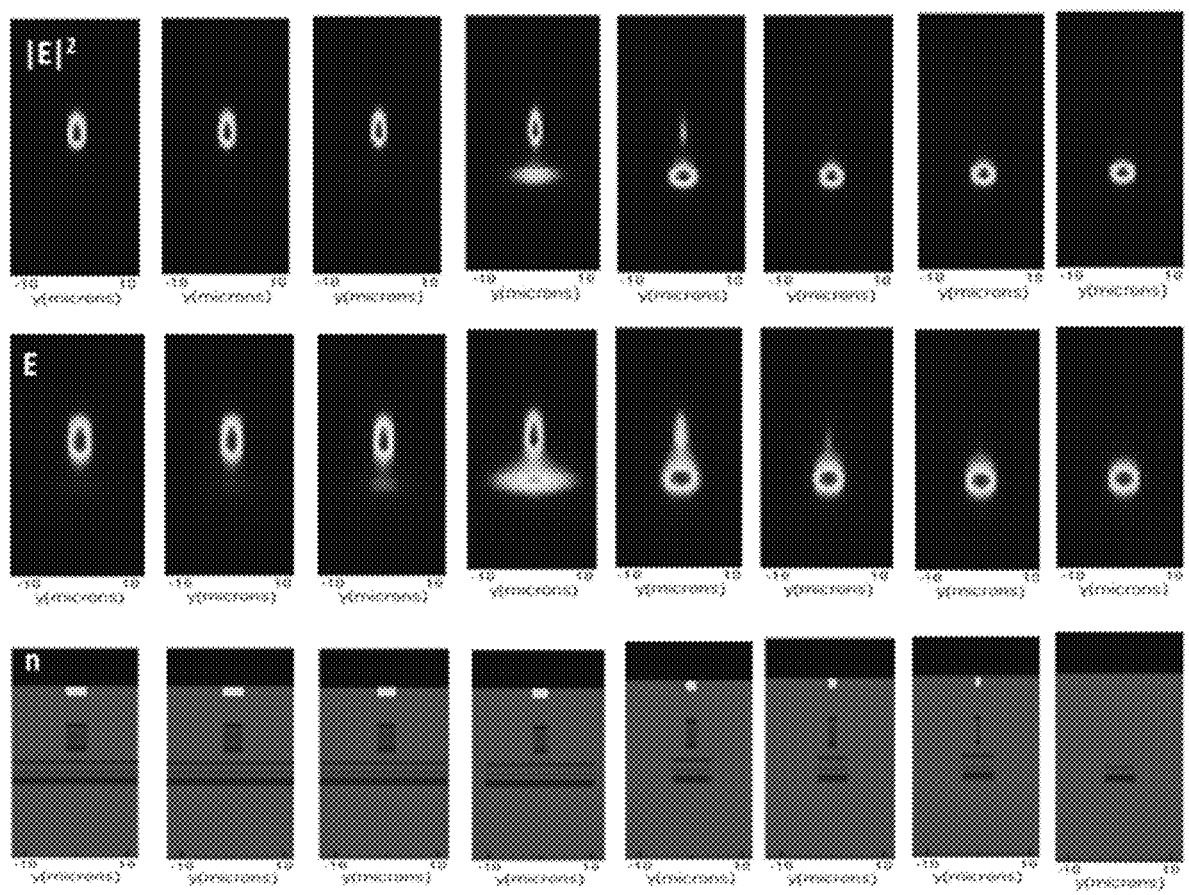
FIG. 5 illustrates the electric field intensity, electric field amplitude, and refractive index profile of the adiabatically tapered structure, as light is coupled from a buried hetero-structure QCL into the passive underlying InGaAs waveguide within the taper region of the OPA of FIG. 1, in accordance with some embodiments.

FIG. 5 illustrates the electric field intensity, electric field amplitude, and refractive index profile of the adiabatically tapered structure, as light is coupled from a buried heterostructure QCL into the passive underlying InGaAs waveguide within the taper region of the OPA of FIG. 1, in accordance with some embodiments.

Figure 6:
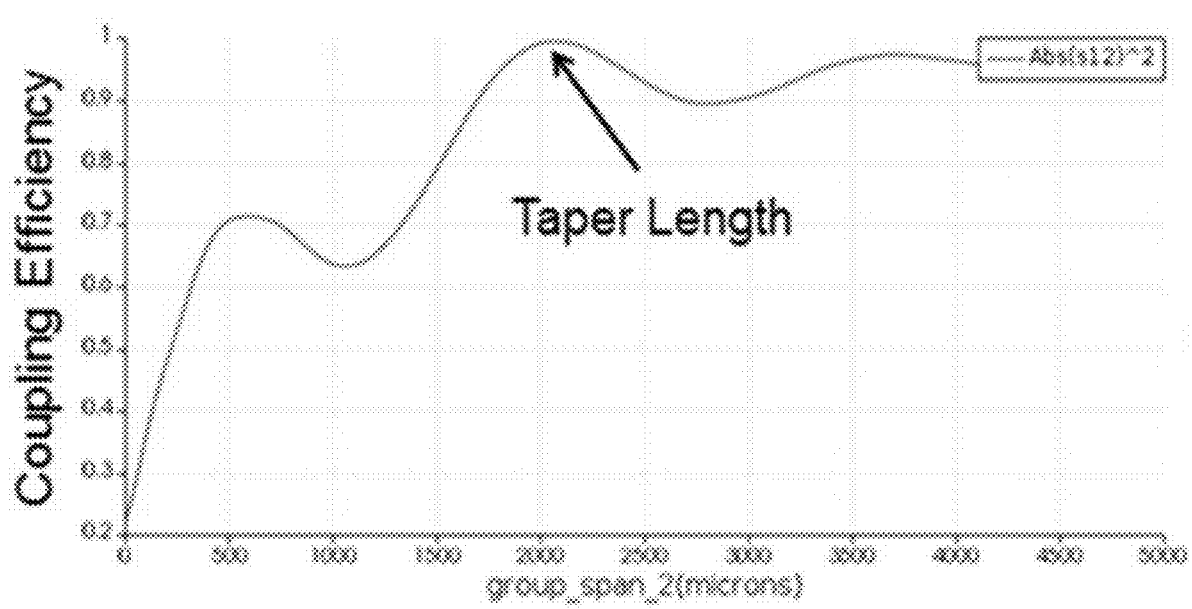
FIG. 6 is a graph of the coupling efficiency versus taper length of the adiabatic taper within the taper region of the OPA of FIG. 1, in accordance with some embodiments.

FIG. 6 is a graph of the coupling efficiency versus taper length of the adiabatic taper within the taper region of the OPA of FIG. 1, in accordance with some embodiments.

For the simulations of the electric field intensity (|E|$^2$), electric field amplitude (E), and refractive index profile (n), the core is modeled to have a refractive index 3.38, while the cladding refractive index is 3.08 for InP confined to the III-V lasing core region. By using EigenWave Expansion in the optical waveguide design software of Lumerical MODE®, the coupling efficiency of light at λ=4.6 μm to an underlying InGaAs passive waveguide is simulated. FIG. 5 shows the simulated evolution of the electric field intensity (|E|$^2$), electric field amplitude (E), and refractive index profile of the fundamental TM00 optical mode from the QCL active region to the underlying passive InGaAs waveguide, via adiabatic tapering of the QCL ridge, along the longitudinal ridge axis. A 4 μm QCL ridge in a buried heterostructure configuration, required for CW operation, is simulated. The underlying passive waveguide is 8 μm wide (tapered down from 100 μm width under the QCL ridge). The simulations show the confinement factors in the top lasing core region and in the bottom passive waveguide core for the lowest-order even supermode as a function of InP waveguide width. As is observable, the even supermode is completely transformed from the III-V laser core to the III-V passive waveguiding section. FIG. 6 shows that greater than 99% coupling efficiency to the underlying InGaAs passive waveguide may be achieved from the QCL emission.

Figure 7:
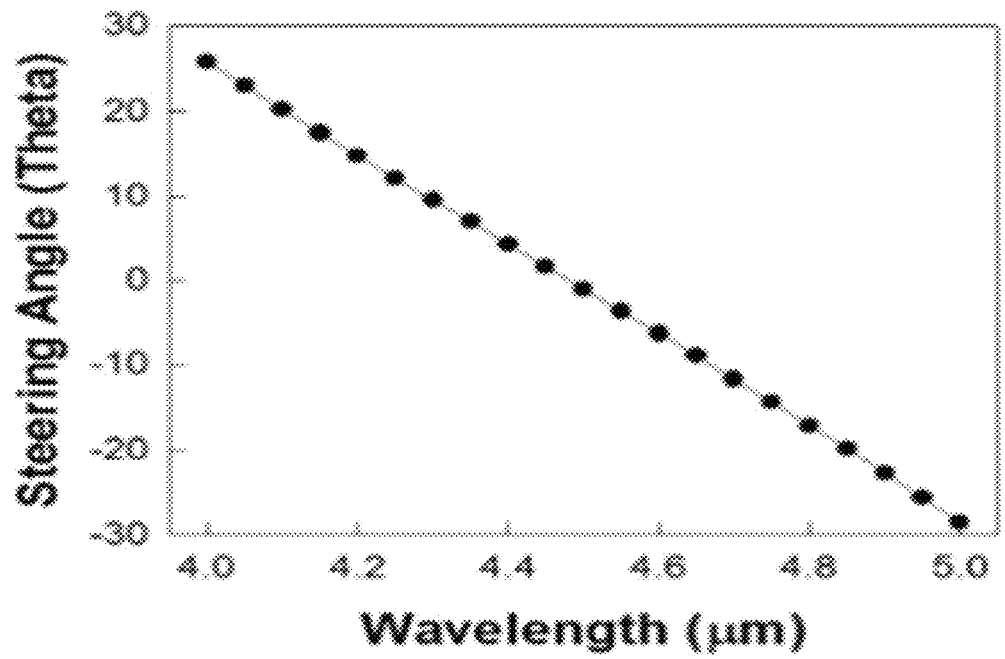
FIG. 7 is a graph of the elevation steering angle as a function of the wavelength, in accordance with some embodiments.

FIG. 7 is a graph of the elevation steering angle as a function of the wavelength, in accordance with some embodiments.

As is illustrated in FIG. 7, for a tunable QCL laser source, the possible beam steering angles range over about 55° for wavelength tuning of the laser source on the order of about 1 μm. Currently, state-of-the-art tunable QCLs around 4.6 μm can provide a tuning range of about 300 nm, which translates to about 13° of elevation steering.

Figure 8:
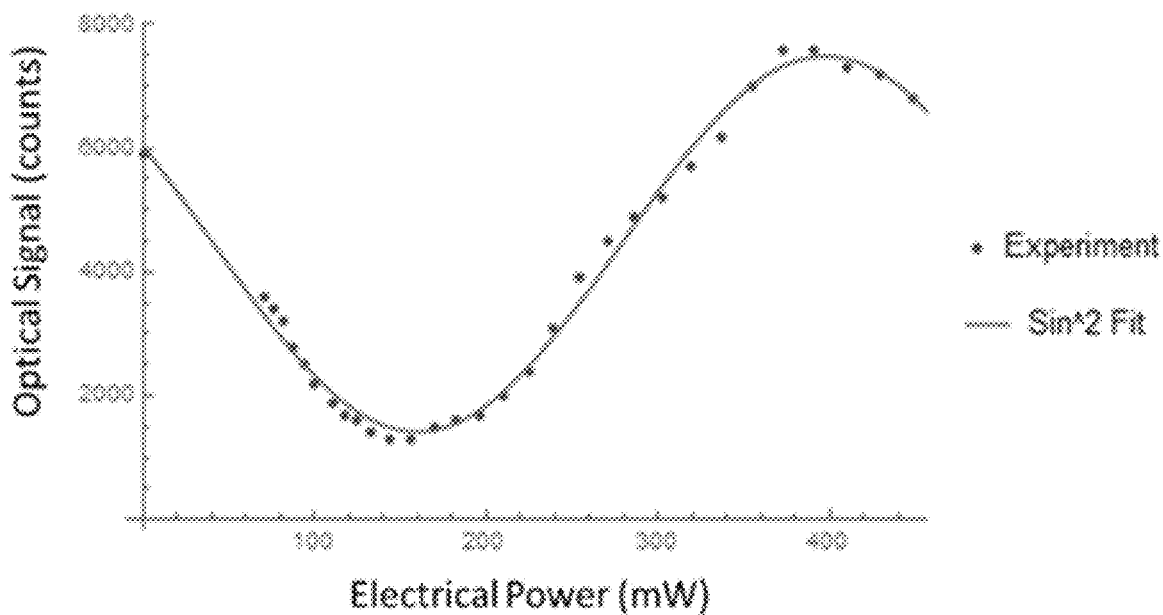
FIG. 8 is a graph of the optical signal from a Mach-Zehnder interferometer versus electrical power for resistive heating of one of the arms of the Mach-Zehnder interferometer, in accordance with some embodiments.

FIG. 8 is a graph of the optical signal from a Mach-Zehnder interferometer versus electrical power for resistive heating of one of the arms of the Mach-Zehnder interferometer, in accordance with some embodiments. 1¶451 The phase shifter characterization was tested with a Mach-Zehnder Interferometer (MZI) fabricated on the same chip as the OPA devices. Input light is coupled into the MZI and output light is viewed and measured with a mid-IR camera, FLIR A6750sc. One arm of the MZI is biased by a probe contact. FIG. 8 shows the optical output from the MZI versus the input electrical power applied to the electrode over one of the arms of the MZI. From this graph, it is estimated the it-phase-shift for maximum steering range occurs at about 225 mW electrical power.

Figure 9:
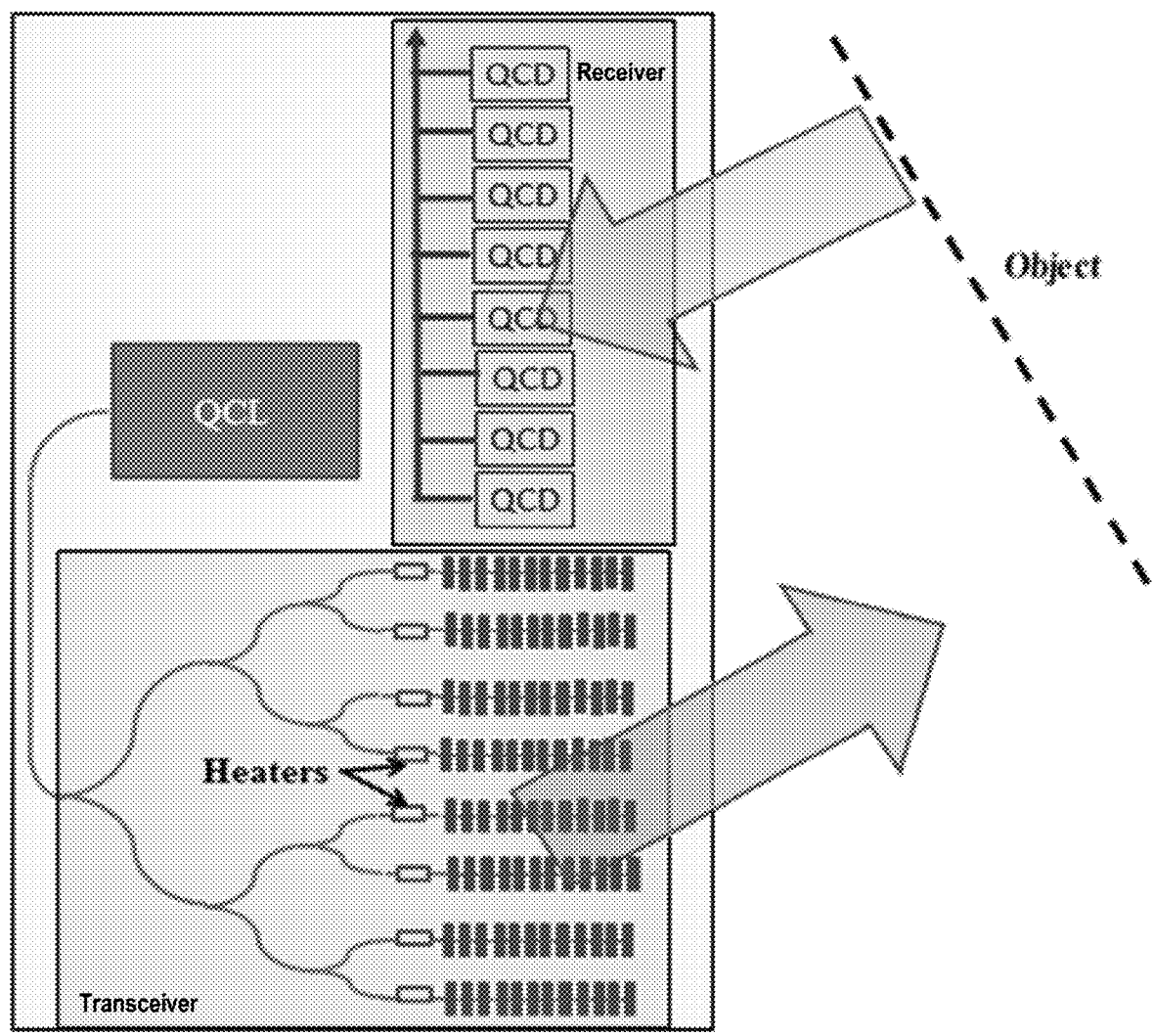
FIG. 9 is a monolithically integrated mid-infrared two-dimensional optical phased array LiDAR, in accordance with some embodiments.

FIG. 9 is a monolithically integrated mid-infrared two-dimensional optical phased array LiDAR, in accordance with some embodiments.

In some embodiments, one or more quantum cascade detectors (QCDs) may be integrated with the monolithically integrated mid-IR two-dimensional optical phased array disclosed and illustrated FIGS. 1-8 to create a non-mechanical, monolithically integrated, compact, lightweight, high-power, on-chip LiDAR system, operable in the mid-IR atmospheric window ($\lambda$=3-5 μm) as schematically shown in FIG. 9. In some embodiments, a QCL heterostructure that simultaneously provides optical gain for the QCL at $\lambda \approx 4.6$ μm under operational bias and acts as an efficient quantum cascade detector at zero bias with the detectivity peak matching the QCL gain wavelength is used. One such QCL heterostructure comprises an active region design with the sequence of alternating $In_{0.362}Al_{0.638}As$ barrier and $In_{0.669}Ga_{0.331}As$ well layers of one QCL period of 3.7/1.5/ 1.1/3.9/1.8/3.8/1.8/3.6/2.2/2.9/1.6/2.5/1.7/2.2/1.8/2.1/2.0/ 2.0/2.0/1.8/2.6/1.8, where the $In_{0.362}Al_{0.638}As$ barrier layer thicknesses in nanometers are shown in bold font and $In_{0.669}Ga_{0.331}As$ well layer thicknesses in nanometers are shown in regular font. Such a device is also strain-compensated.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The benefits and advantages that may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions, and improvements to the embodiments described above are possible. It is contemplated that these variations, modifications, additions, and improvements fall within the scope of the invention as detailed within the following claims.

The invention claimed is:

1. A mid-IR two-dimensional optical phased array comprising:
   an epitaxial wafer having a substrate; a bottom cladding disposed on the substrate; and
   an un-doped waveguide layer disposed on the bottom cladding, the epitaxial wafer comprising a lasing region, a passive waveguiding region adjacent to the lasing region, and a taper region between the lasing region and the passive waveguiding region;
   the lasing region comprising:
      a tunable quantum cascade laser disposed on a portion of the un-doped waveguide layer, the tunable quantum cascade laser having an active region sandwiched between an upper cladding and a lower cladding; an upper metal contact disposed above the upper cladding; and a lower metal contact positioned below the lower cladding, the tunable quantum cascade laser configured to generate mid-IR electromagnetic radiation light from the active region;
   the taper region configured to adiabatically couple the mid-IR electromagnetic radiation light from the active region into the un-doped waveguide layer; and
   the passive waveguiding region comprising:
      a splitter region adjacent to the taper region; the splitter region having a ridge waveguide configured to receive the mid-IR electromagnetic radiation light from the active region and split the mid-IR electromagnetic radiation light into two or more channels with one or more Y-junctions, the ridge waveguide formed into the un-doped waveguide layer and the bottom cladding and having a ridge waveguide cladding disposed over the ridge waveguide;
      a phase shifting region adjacent to the splitter region; the phase shifting region comprising individually controllable heaters disposed over the ridge waveguides of the two or more channels, the individually controllable heaters configured to modify phase of the mid-IR electromagnetic radiation light within each of the ridge waveguides of the two or more channels; and an emission grating region adjacent to the phase shifting region; wherein the ridge waveguides of the two or more channels within the emission grating region comprise exposed emitter gratings etched into the un-doped waveguide layer, the emitter gratings configured to emit the mid-IR electromagnetic radiation light from the ridge waveguides of the two or more channels within the emission grating region;

wherein the emitted mid-IR electromagnetic radiation light is steerable in elevation by wavelength tuning of the tunable quantum cascade laser, and wherein the emitted mid-IR electromagnetic radiation light is steerable in azimuth by controlling of the heaters to modify the phase of the mid-IR electromagnetic radiation light within each of the two or more channels.

2. The apparatus of claim 1, wherein the active region of the tunable quantum cascade laser comprises InGaAs, the lower cladding of the tunable quantum cascade laser comprises doped InP, and the upper cladding of the tunable quantum cascade laser comprises doped InP.

3. The apparatus of claim 1, wherein the un-doped waveguide layer comprises InGaAs and the bottom cladding comprises InP.

4. The apparatus of claim 1, wherein the substrate comprises InP.

5. The apparatus of claim 1, wherein the ridge waveguide cladding comprises Fe:InP.

6. The apparatus of claim 1, wherein the individually controllable heaters comprise individually controllable phase shifter electrodes disposed over a portion of the ridge waveguides of the two or more channels within the phase shifting region and a common lower contact metal positioned below the lower cladding within the phase shifting region.

7. The apparatus of claim 6, wherein the individually controllable heaters further comprise individually controllable metal traces, wherein the individually controllable metal traces are in electrical continuity with the individually controllable phase shifter electrodes and are insulated from the ridge waveguides by a passivation layer.

8. The apparatus of claim 2, wherein the active region of the tunable quantum cascade laser comprises alternating $In_{0.362}Al_{0.638}As$ barrier and $In_{0.669}Ga_{0.331}As$ well layers.

9. The apparatus of claim 8, wherein one quantum cascade laser period of the active region of the tunable quantum cascade laser comprises a 3.7 nm $In_{0.362}Al_{0.638}As$ barrier layer disposed over a 1.5 nm $In_{0.669}Ga_{0.331}As$ well layer disposed over a 1.1 nm $In_{0.362}Al_{0.638}As$ barrier layer disposed over a 3.9 nm $In_{0.669}Ga_{0.331}As$ well layer disposed over a 1.8 nm $In_{0.362}Al_{0.638}As$ barrier layer disposed over a 3.8 nm $In_{0.669}Ga_{0.331}As$ well layer disposed over a 1.8 nm $In_{0.362}Al_{0.638}As$ barrier layer disposed over a 3.6 nm $In_{0.669}Ga_{0.331}As$ well layer disposed over a 2.2 nm $In_{0.362}Al_{0.638}As$ barrier layer disposed over a 2.9 nm $In_{0.669}Ga_{0.331}As$ well layer disposed over a 1.6 nm $In_{0.362}Al_{0.638}As$ barrier layer disposed over a 2.5 nm $In_{0.669}Ga_{0.331}As$ well layer disposed over a 1.7 nm $In_{0.362}Al_{0.638}As$ barrier layer disposed over a 2.2 nm $In_{0.669}Ga_{0.331}As$ well layer disposed over a 1.8 nm $In_{0.362}Al_{0.638}As$ barrier layer disposed over a 2.1 nm $In_{0.669}Ga_{0.331}As$ well layer disposed over a 2.0 nm $In_{0.362}Al_{0.638}As$ barrier layer disposed over a 2.0 nm $In_{0.669}Ga_{0.331}As$ well layer disposed over a 2.0 nm $In_{0.362}Al_{0.638}As$ barrier layer disposed over a 1.8 nm $In_{0.669}Ga_{0.331}As$ well layer disposed over a 2.6 nm $In_{0.362}Al_{0.638}As$ barrier layer disposed over a 1.8 nm $In_{0.669}Ga_{0.331}As$ well layer.

10. The apparatus of claim 1, wherein the tunable quantum cascade laser is strain-compensated.

11. The apparatus of claim 1, further comprising one or more monolithically integrated quantum cascade detectors, the quantum cascade detectors configured for sensitivity to the wavelength of the emitted mid-IR electromagnetic radiation light.

* * * * *